United States Patent [19]

White

[11] Patent Number: 4,673,586
[45] Date of Patent: Jun. 16, 1987

[54] METHOD FOR MAKING PLASTIC CONTAINERS HAVING DECREASED GAS PERMEABILITY

[75] Inventor: Gerald W. White, Dallas, Tex.

[73] Assignee: Cosden Technology, Inc., Dallas, Tex.

[21] Appl. No.: 792,395

[22] Filed: Oct. 29, 1985

[51] Int. Cl.[4] .............................................. B05D 3/06
[52] U.S. Cl. ........................................ 427/38; 427/47
[58] Field of Search ..................... 264/24, 22; 427/38, 427/47

Primary Examiner—Bernard D. Pianalto
Attorney, Agent, or Firm—Roy L. Van Winkle; Michael J. Caddell; M. Norwood Cheairs

[57] ABSTRACT

The apparatus for making plastic containers having decreased gas permeability includes a chamber, an ionizing source located in the chamber for ionizing a material to be deposited on the containers, and a screen located between the ionizing source and the containers for preventing damage to the containers by heat generated by the ionizing source. The method includes the step of locating a screen between the ionization source and the container whereby heat generated by the ionization source will not damage the container.

4 Claims, 2 Drawing Figures

METHOD FOR MAKING PLASTIC CONTAINERS HAVING DECREASED GAS PERMEABILITY

BACKGROUND OF THE INVENTION

The present invention relates generally to plastic containers and more particularly to a method and apparatus for making such containers having improved gas transmission barrier characteristics.

In the food and beverage industry the trend is to move away from packaging perishable products in glass and metal containers and to substitute thermoplastic polymers for the container material. One of the most successful polymers for beverage containers to package beer, wine, and soft drinks has been polyethylene terephthalate (PET). One of the largest markets for PET containers has been in the two-liter carbonated drink field. Another area where PET is expected to be used extensively is in packaging beer and food. In either case, one of the most critical characteristics of the polyester package is the prevention of gas permeation through the wall of the container.

With carbonated soft drinks, the problem with gas permeation is the loss of carbonation ($CO_2$ gas) from the drink through the wall of the bottle or can. Compared to the small, densely-packed metal and glass molecules, polymer molecules are relatively large and form a permeable wall. Even the best polymer known at this time for gas barrier properties, ethylene vinyl alcohol (EVOH), has poor barrier ability when compared to the inorganics such as metals and glass.

On the other hand, beer and food containers preferably should present a good vapor barrier against the ingress of oxygen ($O_2$) into the container because of the accelerated spoilage of the food products caused by the presence of oxygen therein.

There have been several different methods developed in an attempt to increase the "shelf-life" of plastic containers. One of the most common methods involves creating a multi-layered container having a thin barrier layer of a material such as EVOH or polyvinylidene chloride (PVdC) buried between two or more layers of a container polymer suchas PET, polypropylene, polystyrene, or PVC. This multi-layer container is difficult and expensive to manufacture since the barrier layers are either expensive (EVOH) or corrosive (PVdC). Also the process for forming a multi-layered material and making a container from it may be much more complex than single-layer processes.

Another method of creating a barriered polymer container is the process known as "dip-coating". In this process a polymer bottle made of a material such as PET, is first formed into its final shape and then the additional step of dipping the container into a coating solution is performed. This solution may be of a barrier material such as PVdC. This process, in addition to adding another expensive step to the container manufacture, also introduces a material to the container that prevents easy recycling. Because of the nature of PVdC, the coating must be removed by solvents before the polymer container can undergo normal recycling. In light of the trend toward compulsive container return laws in various states and a probable federal deposit/return law, all future container designs must be quickly and easily recyclable. Dip-coated bottles do not lend themselves to easy recycling.

U.S. Pat. No. 4,478,874 issued Oct. 23, 1984 to Granville J. Hahn describes an additional process for improving the gas barrier characteristics of thermoplastic containers. The process described in the patent involves ion-plating the container with a thin, flexible layer of an inorganic oxide.

The present invention overcomes the deficiencies in the methods and apparatus for making the barrier-layer containers, the dip-coated containers and the containers manufactured in accordance with the teaching of U.S. Pat. No. 4,478,874 by providing an improved apparatus and method for making a barrier-treated plastic container which provides excellent barrier characteristics, is cheaply and easily treated, and can be completely recycled by conventional recycling techniques without need for removal of dip-coated layers.

SUMMARY OF THE INVENTION

In one aspect, this invention contemplates improved apparatus for making plastic containers having decreased gas permeability. The apparatus includes an ionization source and the improvement comprises a screen that is located between the ionization source and the containers for preventing damage to the containers by heat generated by radiated heat from the ionization source.

In another aspect, this invention contemplates an improved method of making plastic containers having decreased gas permeability wherein the improvement comprises placing a screen between a source of ionizing material to be deposited on the containers and the containers for preventing damage to the containers by heat generated by the ionization source.

BRIEF DESCRIPTION OF THE DRAWING

The foregoing and additional objects and advantages of the invention will become apparent as the following detailed description is read in conjunction with the accompanying drawing wherein like reference characters denote like parts in all views and wherein.

DESCRIPTION OF THE PREFERRED EMBODIMENT

Figure 1:
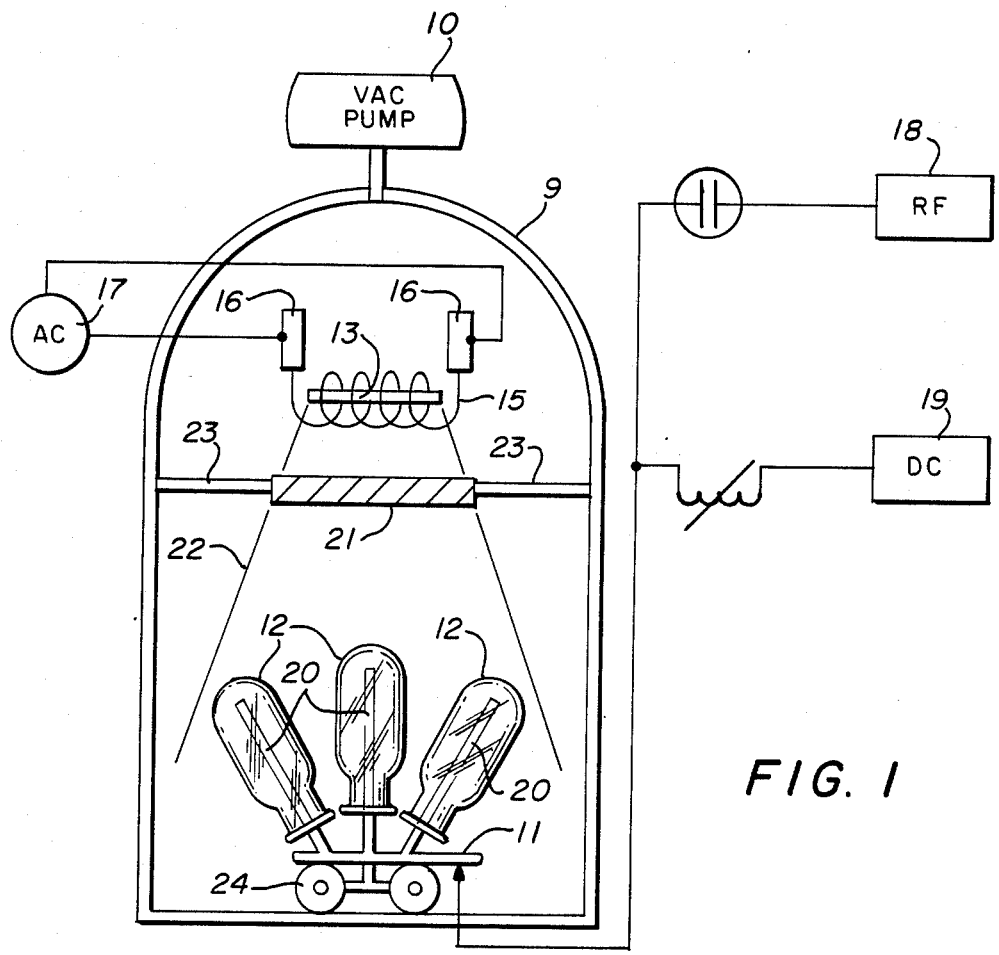
FIG. 1 is a schematic view of apparatus for carrying out the method of the present invention.

Referring to FIG. 1, which is a schematic illustration not drawn to scale, there is disclosed a vacuum chamber 9 including a vacuum pump 10 for reducing the pressure in the chamber 9 to a desired sub-atmospheric value and having a bottle holder 11 rotatably located therein. At least one plastic bottle 12 is loosely retained on the bottle holder 11 below a source of ionizable, inorganic coating material 13 located in a vaporizing filament 15.

Filament 15 is electrically connected to and supported by a pair of terminals 16. The filament 15 is preferably a resistant heating element powered by an external AC power supply 17. The coating material 13, held in the filament 15, is vaporized thereby. Ionizing energy, comprising radio frequency generated by an RF source 18 and a biasing DC voltage from a DC source 19, are applied through a brush or commutator 14 and appropriate circuits to holder 11.

The bottle holder 11 which is electrically isolated from the remainder of the system serves as a radiating antenna for the RF and DC bias. Bottle holder 11 includes an optional magnet 20 which projects into each bottle 12 setting up a magnetic field therein. The magnets 20 prolong the residency of the thermionic electrons around the bottles 12 and thereby increase the efficiency of the system. It is believed that the efficiency is increased by spiraling the thermionic electrons in the magnetic field which increases the electron density and availability for ionization of evaporant atoms in the vicinity of the bottles 12.

As a result of the vaporization of the source material and the ionizing and biasing field created by the DC/RF power supply, a plasma of ionized SiO particles (for example) forms between the filament 15 and the magnets 20 in the bottle holders 11. The bias aligns and stabilizes the SiO ions in the chamber 9. The ions impinge on the outer surface of the polyester bottles 12 while traveling at very high velocities and apparently penetrate partially into the surface of the polymer.

An even coating of the ionized materials is obtained on the bottles 12 by rotating the bottles 12 about one or more of their axes during the impingement cycle. Accordingly, rotational apparatus 24 which must be electrically isolated is schematically illustrated in FIG. 1.

As would be expected, a substantial amount of heat is generated during the ionization process. The bottles 12 are constructed from a thermoplastic and sufficient heat may be generated to have a detrimental effect on the bottles 12 during the ion plating process.

An opaque screen 21 is located in the chamber 9 between the filament 15 and the bottles 12. The screen 21 is of sufficient size so that no part of the bottles 12 is "visible" to the extremely hot filament 15. This arrangement is illustrated schematically in FIG. 1 by the lines 22. The screen 21 is supported by appropriate support members 23 in the chamber 9 and is constructed from a material that is not affected by the heat generated while the evaporation and ionization process is taking place.

DESCRIPTION OF THE EMBODIMENT OF FIG. 2

Figure 2:
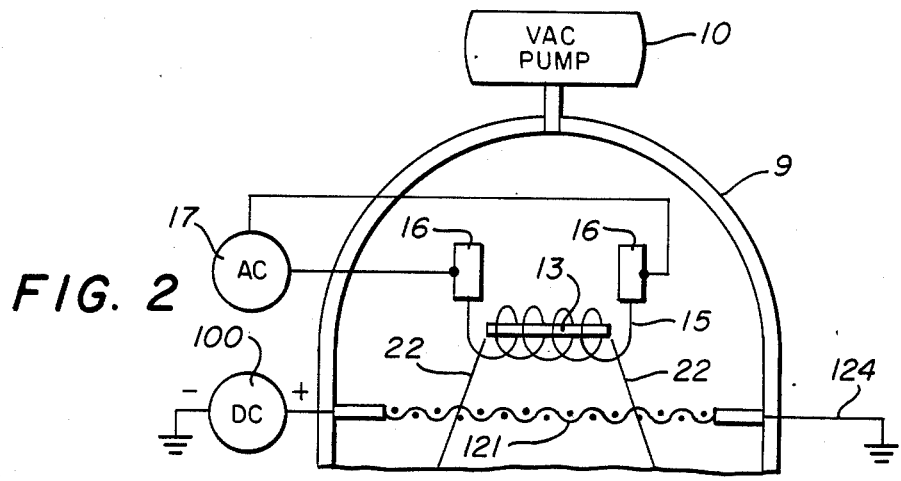
FIG. 2 is a fragmentary schematic view of a modified form of the apparatus of FIG. 1.

FIG. 2 is a schematic diagram of a portion of the apparatus of FIG. 1, but illustrating a modification thereof. Many of the parts utilized in FIG. 2 are the same as those utilized in FIG. 1 and will be designated by the same reference characters.

As illustrated therein, the chamber 9 includes the vacuum pump 10 for lowering the pressure in the chamber 9 to the predetermined subatmospheric value. An AC power source 17 is connected by appropriate circuits to the terminals 16 which support the heating filament 15. As was true in FIG. 1, the inorganic coating material 13 is located in the filament 15 and arranged to be heated thereby.

In lieu of the opaque screen 21 of FIG. 1, the embodiment of FIG. 2 is provided with a grid or mesh screen 121 that is connected to ground at 124 and is connected to a direct current source 100 which provides a small positive bias to the screen 121. The positive bias does not need to be very large and may be in the vicinity of 4 volts DC. It is believed that the screen 121 will be effective, as will be described, even if no positive bias is imposed thereon. Accordingly, the DC source 100 could be eliminated if desired. The screen 121 is of sufficient size so that no part of the bottles 12 (see FIG. 1) are "visible" to the filament 15.

In the operation of the embodiment of FIG. 2, the AC power source 17 provides sufficient power to the filament 15 to vaporize the coating material 13. During this process, thermionic electrons are driven off by the heat. The thermionic electrons are extremely hot and provide a great deal of the heat energy which could cause damage to the bottles 12. The filament 15 also generates ultraviolet and infrared which will penetrate the screen 121 but are not believed sufficiently intense to cause damage to the bottles 12. The thermionic electrons, which could cause damage to the bottles 12, will not penetrate the screen 121 but are attracted thereto and attach themselves to the screen 121 and thus do not reach the bottles 12. The positive DC voltage imposed on the screen 121 in the preferred form of FIG. 2, will be slightly more efficient than the screen 121 when simply grounded in the traction of the thermionic electrons. Neutral evaporative ions or positive ions of the coating material will pass through the screen 121 to reach the bottles 12.

The impingement or ionization cycle is maintained long enough to obtain a coating layer of around 500 Angstroms thickness. The result is a clear flexible coating of SiO, for example, on the outer surface of the polyester bottles 12. It is believed that the ionized material penetrates partially into the polymer and plugs the interstices between the polymer chains rendering the material substantially impermeable to gases. This plugging of the interstices is believed to be a main contributor to the improvement in gas barrier characteristics of the SiO coated container. While 500 Angstroms is considered a good coating thickness, other thicknesses ranging from less than 500 to as high as 5000 Angstroms or more might be used depending on the type of polymer, the container shape, and the size and thickness of the container.

In addition to the impingement coating of polyesters such as PET it is believed that most other polymers can also be coated successfully. It is also expected that other inorganic materials may be substituted for SiO, for example aluminum oxide and titanium oxide. Most inorganic or metallic oxides should be adaptable to this process. It should also be noted that even though the metals of these plating compounds are generally opaque, their oxides are clear and thus they can be used on both clear and pigmented polymers without affecting the aesthetic of the containers.

Recyclability of the used coated containers is not affected detrimentally because of the extremely small amount of inorganic coating used. Because of its inert nature and presence in small amounts, the coating will not be noticeable in the recycled polymer. The amount of inorganic coating is less than 1% by weight of the polymer in the container. Some containers have inorganic pigments such as titanium dioxide mixed with their polymers in amounts as high as 25% by weight without affecting recyclability; therefore it can be seen how negligible the effect of the coating material is on recyclability using the present invention.

Although specific preferred embodiments of the present invention have been described in the detailed description above, the description is not intended to limit the invention to the particular form or embodiments disclosed since they are to be recognized as illustrative rather than restrictive and it will be obvious to those skilled in the art that the invention is not so limited. For example it is contemplated that plating materials other than silicon monoxide, aluminum oxide, and titanium oxide can be used. One such material would be tantalum oxide. Also containers other than carbonated beverage bottles would benefit from the present invention, such as beer containers, food containers, and medicine containers. Thus the invention is declared to cover all changes and modifications of the specific examples of the invention herein disclosed for purposes of illustration, which do not constitute departures from the spirit and scope of the invention.

What is claimed is:

1. A method of making plastic containers having decreased gas permeability comprising the steps of:

ionizing a material to be deposited on the plastic container:

locating a magnetic field in said container whereby the residency of said thermionic electrons about said containers is prolonged; and, positioning a screen between the containers and the material being ionized for preventing damage to said containers by heat generated by ionization.

2. The method of claim 1 and including the steps of:

locating the ionization means, containers, and screen in a chamber; and, connecting a vacuum pump to said chamber and reducing the pressure in said chamber to subatmospheric.

3. The method of claim 1 and further including the step of rotating the containers to aid in obtaining an even distribution of ionized material on said containers.

4. The method of claim 1 including the step of imposing a positive direct current bias on said screen.

* * * * *